(12) United States Patent
Borrelli et al.

(10) Patent No.: US 6,309,991 B1
(45) Date of Patent: *Oct. 30, 2001

(54) SILICA WITH LOW COMPACTION UNDER HIGH ENERGY IRRADIATION

(75) Inventors: Nicholas F. Borrelli; Thomas P. Seward, III, both of Elmira; Charlene Smith, Corning, all of NY (US)

(73) Assignee: Corning Incorporated, Corning, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/254,114

(22) PCT Filed: Aug. 27, 1997

(86) PCT No.: PCT/US97/15233

§ 371 Date: Feb. 25, 1999

§ 102(e) Date: Feb. 25, 1999

(87) PCT Pub. No.: WO98/08775

PCT Pub. Date: Mar. 5, 1998

Related U.S. Application Data

(60) Provisional application No. 60/024,995, filed on Aug. 29, 1996.

(51) Int. Cl.$^7$ .............................. C03C 3/06; C03B 27/012
(52) U.S. Cl. ............................ 501/54; 501/12; 65/413; 65/416; 65/422; 65/426; 65/30.1; 65/33.2; 430/5
(58) Field of Search .................... 501/12, 54; 65/413, 65/416, 422, 426, 30.1, 33.2; 430/5

(56) References Cited

U.S. PATENT DOCUMENTS

| | | | |
|---|---|---|---|
| 3,933,454 | * | 1/1976 | DeLuca ........................ 65/3 |
| 4,789,389 | | 12/1988 | Schermerhorn et al. . |
| 5,043,002 | * | 8/1991 | Dobbins et al. ................ 65/3.12 |
| 5,086,352 | | 2/1992 | Yamagata et al. . |
| 5,152,819 | | 10/1992 | Blackwell et al. . |
| 5,154,744 | | 10/1992 | Blackwell et al. . |
| 5,325,230 | | 6/1994 | Yamagata et al. . |
| 5,364,433 | * | 11/1994 | Nishimura et al. ............ 65/17.4 |
| 5,410,428 | | 4/1995 | Yamagata et al. . |
| 5,523,266 | | 6/1996 | Nishimura et al. . |
| 5,616,159 | | 4/1997 | Araujo et al. . |
| 5,668,067 | | 9/1997 | Araujo et al. . |
| 5,707,908 | * | 1/1998 | Komine et al. ................ 501/53 |
| 5,735,921 | | 4/1998 | Araujo et al. . |
| 5,896,222 | * | 4/1999 | Rosplock et al. ................ 501/54 |
| 5,958,809 | * | 9/1999 | Fujiwara et al. ................ 501/54 |
| 6,087,283 | * | 7/2000 | Jinbo et al. ................ 501/54 |
| 6,205,818 | * | 3/2001 | Seward, III ................ 65/33.2 |

FOREIGN PATENT DOCUMENTS

406016449A * 2/1993 (JP) .

9300307A1 * 1/1993 (WO) .

OTHER PUBLICATIONS

Allan et al., "193–nm excimer–laser–induced densification of fused silica". *Optics Letters*, 21:24, Dec. 15, 1996, 1960–1962..

Borrelli et al., "Densification of fused silica under 193–nm excitation", *J. Opt. Soc. Am. B*, 14:1606–1615, Jul. 1997.

EerNisse, E., "Compaction of ion–implanted fused silica," *J. Appl. Phys.*, 45:167–174 (1974). No month.

Imai, et al., "UV and VUV Optical Absorption Due to Intrinsic and Laser Induced Defects in Synthetic Silica Glasses" in *The Physics and Technology of Amorphous SiO$_2$*, edited by Roderick A. B. Devine, Plenum Press, New York, 153–159, (1988). No month.

Lillie et al., "Fine Annealing of Optical Glass" *J. Am. Cer. Soc.*, 37:466–473, 1954. No month.

Moynihan, et al., "Dependence of the fictive temperature of glass on cooling rate," *J. Am. Cer. Soc.* 59:12–16 (1976). No month.

Nagasawa et al., "Improvement of Radiation Resistance of Pure Silica Core Fibers by Hydrogen Treatment," *Japanese Journal of Applied Physics* 24:1224–1228 (1985). No month.

Norris et al., "Ionization dilatation effects in fused silica from 2 to 18–keV electron irradiation," *J. Appl. Phys.* 45, 3876–3882 (1974). No month.

Primak et al., "The Radiation Compaction of Vitreous silica", *J. Appl. Phys.* 39, 5651–5658 (1968). No month.

Primak, W., "Dependence of the compaction of vitreous silica on the ionization dose," *J. Appl. Phys.* 49, 2572 (1977).

Primak, W., Section C, "Ionization Compaction," in "The compacted States of Vitreous Silica," vol. 4 of *Studies in Radiation Effects in Solids*, edited by G.J. Dienes and L.T. Chadderton (Gordon and Breach, 1975), 91–102. No month.

Rothschild et al., "Effects of excimer laser irradiation on the transmission, index of refraction, and density of ultraviolet grade fused silica", *Appl. Phys. Lett.* 55:1276–127 (1989). No month.

Ruller et al., "The effect of gamma–irradiation on the density of various types of silica", *Journal of Non–Crystalline Solids*, 136:163–172, 1991. No month.

Schenker et al., "Degradation of fused silica at 193–nm and 213–nm," *SPIE*, 2440:118–125, 1995. No month.

Schenker et al., "Ultraviolet damage properties of various fused silica materials," *SPIE*, 2428:458–468 (1995). No month.

(List continued on next page.)

*Primary Examiner*—Karl Group
(74) *Attorney, Agent, or Firm*—Angela N. Nwaneri; Maurice Klee

(57) ABSTRACT

Fused silica stepper lens for photolithographic application are disclosed which are resistant to laser-induced damage, specifically, compaction or densification which can lead to an increase in the optical path length of the lens. The figure compares the phase front distortions of a standard fused silica with the phase front distortions observed in two inventive stepper lens fused silica.

2 Claims, 1 Drawing Sheet

OTHER PUBLICATIONS

Schenker et al., "Material Limitations to 193–nm Lithographic System Lifetimes," *SPIE*, 2726:698–707 (1996). No month.

Schermerhorn, P. "Excimer Laser Damage Testing of Optical Materials," *SPIE*, 1835:70–79, 1992. No month.

Schroeder, "Brillouin Scattering and Pockels Coefficients in Silicate Glasses", *Journal of Non–Crystalline Solids*, 40:549–566, 1980. No month.

Shelby, "Radiation effects in hydrogen–impregnated vitreous silica", *J. Appl. Phys.*, 50:3702–3706, 1979. No month.

Smith et al., "193–nm excimer laster induced processes of fused silica," presented at $2^{nd}$ International Symposium on 193–nm Lithography, Colorado Springs, CO, Jul. 30–Aug. 2, 1996.

Derwent Acc No.: 1993–03801, Fujinoki et ak, "Mfg. Silica Glass Article for Use with an Excimer Laser", Feb. 1993.*

* cited by examiner

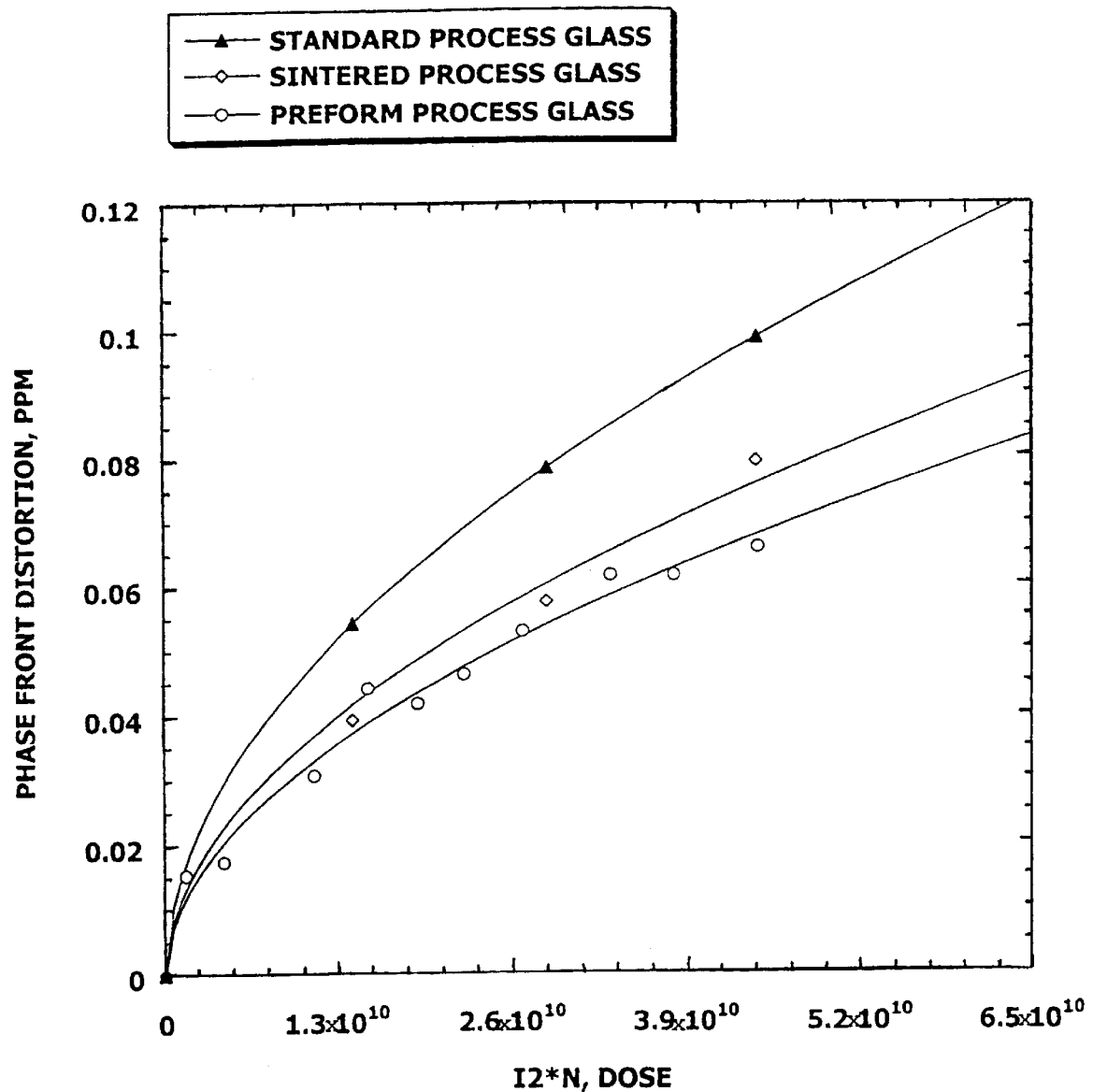

SILICA WITH LOW COMPACTION UNDER HIGH ENERGY IRRADIATION

This application claims benefit of Provisional Application No. 60/024,995, filed Aug. 29, 1996.

FIELD OF THE INVENTION

This application claims priority to U.S. provisionalapplication no. 60/024995, filed Aug. 29, 1996. The invention relates to stepper lens from fused silica having low compaction under high energy irradiation, particularly adaptable for use in photolithography applications at wavelengths of 193 and 248 nm.

BACKGROUND OF THE INVENTION

Fused silica is highly relevant to such applications as windows and mirrors used in outer space, and increasingly, it is becoming relevant to optical elements for deep ultraviolet photolithography. However, it is generally known that prolonged exposure of fused silica to intense deep ultraviolet radiation of the type utilized in photolithography leads to optical damage which is generally manifested in the form of changes in the optical and physical properties of the glass.

One form of optical damage observed in fused silica glass is a physical densification or compaction of the exposed regions of the glass. Compaction is generally observed by interferometry where the alteration of the optical phase front is measured through the damaged regions, and is reported as optical path difference, the product of refractive index and path length, in ppm or waves of 633 nm light. Thus, the optical phase front of stepper lens elements for photolithographic applications which utilize deep ultraviolet wavelengths at 193 and 248 nm for high resolution microcircuit fabrication may become altered due to optical modification as a consequence of prolonged exposure. Even though small changes in the optical phase front produced by the effect of exposure over the life of the lens barrel are expected, at present the maximum acceptable change is not known. What is known however, is that there is a relationship between alterations in fused silica and the ultimate effect of such changes on the wavefront.

The question of what factors contribute to the propensity of various silica materials to optical damage when exposed to high energy laser irradiation is not settled and several possible answers have been advanced in the literature.

Recently, in co-assigned, co-pending PCT patent application Ser. No. PCT/US97/11697, deposited Jul. 1, 1997, titled "Fused Silica Having High Resistance to Optical Damage," it was suggested that radiation-caused optical damage can be minimized or eliminated by precompacting fused silica by such processes as hot isostatic pressing and by high energy pre-exposure in order to thereby desensitize the glass to subsequent high energy irradiation during actual use.

There continues to be a need for laser damage resistant fused silica. Accordingly, it is the object of the present invention to provide a fused silica stepper lens which is resistant to laser-induced damage, specifically defined as densification.

SUMMARY OF THE INVENTION

Briefly, the invention relates to a fused silica stepper lens which is resistant to laser-induced compaction. In particular, the invention relates to stepper lenses made by flame hydrolysis, and sol gel methods.

BRIEF DESCRIPTION OF THE DRAWING

The FIGURE compares the phase front distortions of a standard fused silica with the phase front distortions observed in two inventive stepper lens fused silica.

DETAILED DESCRIPTION OF THE INVENTION

Ideally, fused silica glass for photolithographic applications should be resistant to laser-induced optical damage. To be resistant to laser-induced optical damage, stepper lenses for photolithographic applications should be resistant to laser-induced absorption and compaction. However, most fused silica stepper lenses available today have shown a tendency to optically deteriorate after prolonged exposure to excimer laser radiation. We have demonstrated that stepper lenses made from fused silica glasses produced by certain processes are more resistant to laser-induced compaction than are lenses made by conventional stepper lens manufacturing methods such as the boule process.

Structural change in fused silica has at least two ramifications: (1) a geometric change in the densified region, which gives rise to a decrease in the optical path length; and (2) an increase in the refractive index of the fused silica caused by an increase in density. These two effects result in a net change (increase) in the optical path length (optical path difference, OPD).

Typically, density increases caused by high energy irradiation are very small (in the range of about 1 to 50 ppm), so that direct measurements of the absolute density range can be impractical. For the purpose of this work we have used interferometric measurements to characterize relative density changes across fused silica samples, measuring densified (exposed) and undensified (non-exposed) regions of each sample.

Examples of useful processes include, (1) the flame hydrolysis process described in U.S. Pat. Nos. 5,043,002 and 3,933,454 both of which are sometimes referred to herein as the waveguide process; and (2) the sol-gel method described in U.S. Pat. No. 4,789,389 which is sometimes referred to herein as the sintered process.

One method of making fused silica lenses which are resistant to laser-induced compaction is by the flame hydrolysis process. In a conventional flame hydrolysis method, a coating of flame hydrolysis-produced glass soot is deposited on a starting member to form a soot preform. The preform is consolidated to form a dense glass layer which can then be formed into a desired shape. In the consolidation step, the soot preform is subjected to a temperature in the consolidation temperature range for a time sufficient to permit the soot particles to fuse and consolidate, thereby forming a dense glass layer which is free from particle boundaries. Alternatively, such glass can be made using an improved flame hydrolysis process as described in U.S. Pat. No. 3,933,454. In the consolidation step of the improved process, the soot preform is heated to a temperature within the consolidation temperature range for a time sufficient to cause the soot particles to fuse and form a dense glass layer. Simultaneous with the consolidation, the glass is subjected to a stream of a substantially dry chlorine containing atmosphere.

Generally, in the fused silica process a vaporous stream of silicon-containing compound is converted, through thermal decomposition with oxidation or flame hydrolysis, to $SiO_2$. The gas stream is then passed into the flame of a combustion burner to form amorphous particles of fused $SiO_2$ which are then deposited onto a support and consolidated to form fused silica. To produce the inventive stepper lens, the amorphous particles are consolidated in a chlorine-containing environment to purify the glass. In a particularly useful modified process, the deposit of amorphous particles are consolidated in a He/HCl-containing atmosphere to form a transparent glass body.

Useful silicon-containing compounds for forming fused silica glass are well known in the industry such as disclosed collectively in U.S. Pat. Nos. 3,393,454; 4,789,389; 5,043,002; 5,152,819; and 5,154,744, all herein incorporated by reference. Preferably, the silicon-containing gaseous feedstock includes compounds that can be oxidized by flame hydrolysis or pyrolysis, to produce transparent, high-purity silica glass articles. However, for safety and environmental reasons, halide-free, cylcosiloxane compounds are preferred.

Examples of useful halide-free silicon-containing compounds include cyclosiloxane compounds, preferably, polymethylsiloxane such as hexamethyldisiloxane, polymethylcyclosiloxane, and mixtures of these. Examples of particularly useful polymethylcyclosiloxane, include, hexamethylcyclotrisiloxane, decamethylcylcopentasiloxane, octamethylcyclotetrasiloxane and mixtures of these.

In addition to polymethylsiloxanes, organosilicon materials satisfying the following three criteria can also be used to produce the inventive stepper lens:

(1) an operable organosilicon-R compound (R is an element of the Periodic Table) will have a Si—R bond dissociation energy that is no higher than that of the Si—O bond;

(2) an operable organosilicon-R compound will exhibit a significant vapor pressure at temperatures below 250° C. and a boiling point no higher than 350° C.; and, in the interest of safety, (3) an operable organosilicon-R compound will, upon pyrolysis and/or hydrolysis, yield decomposition products besides $SiO_2$ which are deemed to be environmentally safe or the emissions are below acceptable governmental standards.

Three groups of compounds which have previously been found to be especially useful are categorized below according to the bonding arrangement in the basic structure:

(1) organosilicon-oxygen compounds, having a basic Si—O—Si structure, in particular linear siloxanes wherein an oxygen atom and a single element or group of elements, such as a methyl group, is bonded to the silicon atom;

(2) organosilicon-nitrogen compounds, having a basic Si—N—Si structure, such as aminosilanes, linear silazanes, and cyclosilazanes, wherein a nitrogen atom and a single element or group of elements are bonded to the silicon atom; and (3) siloxasilazanes, having a basic Si—N—Si—O—Si structure, wherein a nitrogen atom and an oxygen atom are bonded to the silicon atom.

Other useful halide-free silicon-containing compounds for the method of the invention include octamethyltrisiloxane (an operable linear siloxane), aminosilanes such as tris(trimethylsiiyl) ketenimine, linear silazanes such as nonamethyltrisilazane, cyclosilazanes such octamethylcyclotetrasilazane, and siloxasilazanes such as hexamethyl-cyclotrisiloxazane.

In one particularly useful method of the invention, halide-free, cyclosiloxane compound such as octamethylcyclotetrasiloxane (OMCTS), represented by the chemical formula, —$[SiO(CH_3)_2]_4$—, is used as the feedstock in the vapor deposition processes such as used in making high purity fused silica for optical waveguide applications.

The invention is further illustrated below by reference to the figure in which the phase front distortion (ppm) is plotted versus dose of exposure, $|^2N$; where ($|$) is the laser intensity, and N is the number of pulses. The reciprocity of the dose parameter allows one to calculate the total exposure dose that a sample will see without regard to the intensity or number of pulses and, using the equation given on the figure, predict the densification. What this means in the practical sense is that the quantity is what is important, not how the sample gets there.

The application for this material is photolithography, therefore, in the following sections we clearly demonstrate that the sol gel (sintered) and waveguide (preform) processes produce fused silica glasses which are less compacting over the predicted lifetime of a lithographic lens than fused silica lenses made by the standard (boule) process. In the figure, the result for the fused silica sample produced from the standard boule process is represented by triangles, the sintered process by diamonds, and the preform process by circles. Sample geometries and laser exposure arrangements were the same for all samples studied.

The plotted phase front distortion for the sintered process was obtained directly from interferometric data. For the preform process, the peak-to-valley phase front distortion was calculated from birefringence measurements using the conversion reported in Borrelli, Smith, Allan, and Seward, "Densification of fused silica under 193-nm excitation", J. Opt. Soc. Am. B/Vol. 14, No. 7/July 1997, 1606, and Allan, Smith, Borrelli, and Seward, "193-nm excimer-laser-induced densification of fused silica", OPTICS LETTERS/ Vol. 21, No. 24/ Dec. 15, 1996, 1960, incorporated herein by reference For the standard fused silica glass we used samples of Corning's Code HPFS® fused silica (Corning, N.Y.), which had been optimized for deep ultraviolet transmittance and optical homogeneity.

In the figure we have shown data from 0 to about 0.4 (633 nm) waves, which is reasonably the practical limits of distortion for photolithographic application. The figure compares the measured compaction between fused silica made by the standard process (triangles) glass and stepper lens fused silica made by the sintered (diamonds) and waveguide (open circles) processes over the lifetime of a lens. For this purpose, we have assumed that the optical elements will be subjected to a fluence ($|$) of 0.5 $mJ/cm^2$/pulse for 8 years. We have further assumed that the laser will have a repetition rate of 1000 Hz and the stepper containing the lens will be run for 7 days a week, 24 hours a day, 365 days a year, yielding a lifetime dose ($|^2N$) of $6.3 \times 10^{10}$. Inspection of the graph shows that fused silica made by the standard process exhibits about 0.28 waves of distortion at this dose, while fused silica made by the sintered and waveguide processes exhibit phase front distortions of only 0.22 and 0.18 waves, respectively. It is significant to note that the curves for the sintered and waveguide samples are below the curve for the standard process glass over the entire lifetime of the fused silica.

It is to be understood that various changes and modifications which do not constitute departures from the spirit and scope of the invention will be apparent to persons skilled in the art, which changes and modifications are embraced by the present invention.

What is claimed is:

1. A method for producing a fused silica stepper lens which is resistant to compaction when exposed to high intensity excimer radiation comprising the steps of:

(a) depositing on a starting member a coating of flame hydrolysis-produced glass soot to form a soot preform;

(b) consolidating the soot preform to form a dense glass layer free from particle boundaries; and (c) forming said dense glass layer into a stepper lens;
   said consolidation step being characterized in that it comprises heating said soot preform to a temperature within the consolidation temperature range for a time sufficient to cause said soot particles to fuse and form a dense glass layer, and simultaneously subjecting the soot preform to a stream of a substantially dry, hydrogen-free, chlorine containing atmosphere;
   wherein said method also comprises:
      (i) exposing a sample of fused silica made by steps (a) and (b) to high intensity excimer radiation; and
      (ii) determining the resulting compaction of said sample.

2. A process comprising:

(I) producing a fused silica stepper lens which is resistant to compaction when exposed to high intensity excimer radiation by a method comprising:

(a) depositing on a starting member a coating of flame hydrolysis-produced glass soot to form a soot preform;

(b) consolidating the soot preform to form a dense glass layer free from particle boundaries; and (c) forming said dense glass layer into a stepper lens;
      said consolidation step being characterized in that it comprises heating said soot preform to a temperature within the consolidation temperature range for a time sufficient to cause said soot particles to fuse and form a dense glass layer, and simultaneously subjecting the soot preform to a stream of a substantially dry, hydrogen-free, chlorine containing atmosphere; and (II) using the stepper lens formed in step (c) to perform photolithography.

* * * * *